US007148504B2

(12) United States Patent
Yamada

(10) Patent No.: US 7,148,504 B2
(45) Date of Patent: Dec. 12, 2006

(54) SEMICONDUCTOR DEVICE

(75) Inventor: Junji Yamada, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 172 days.

(21) Appl. No.: 10/985,997

(22) Filed: Nov. 12, 2004

(65) Prior Publication Data
US 2005/0236617 A1    Oct. 27, 2005

(30) Foreign Application Priority Data
Apr. 26, 2004  (JP)  ............. 2004-129251

(51) Int. Cl.
*H01L 23/58* (2006.01)
(52) U.S. Cl. .................. 257/48; 257/773; 257/784
(58) Field of Classification Search ............... 257/48, 257/773, 341, 782, 784, 786
See application file for complete search history.

(56) References Cited
U.S. PATENT DOCUMENTS
5,804,859 A    9/1998   Takahashi et al.

2005/0236617 A1 * 10/2005  Yamada ................. 257/48

FOREIGN PATENT DOCUMENTS
JP    8-195411    7/1996

* cited by examiner

*Primary Examiner*—Mark V. Prenty
(74) *Attorney, Agent, or Firm*—McDermott Will & Emery LLP

(57) ABSTRACT

One of aspects of the present invention is to provide a semiconductor device, which includes an insulating substrate, and a semiconductor chip mounted on the insulating substrate. The semiconductor chip has a chip electrode thereon. The semiconductor device also includes a first terminal electrically connected with the chip electrode through a first metal wire, and a second terminal electrically connected with the chip electrode through a second metal wire that is more likely to be disconnected than the first metal wire. A signal of disconnection of the second metal wire is output at the second terminal.

10 Claims, 6 Drawing Sheets

SEMICONDUCTOR DEVICE

BACKGROUND OF THE INVENTION

1) Technical Field of the Invention

The present invention relates to a power semiconductor device used for controlling large current of an electronic equipment such as a motor and heater. In particular, it relates to the semiconductor device capable of predicting the timing when a metal wire is likely to fail (disconnect).

2) Description of Related Arts

In general, the power semiconductor device (referred to as a "power module" herein) is used as a power source for supplying a substantial amount of current to an electronic equipment such as a motor and heater. Thus, if the power module fails to supply a desired controlled current, the electronic equipment incorporating the power module cannot achieve predetermined functions, and even worse, may often have a fatal problem such as a burnout due to an overcurrent. Therefore, such a power module is required to have a fairly high level of reliability.

Meantime, so-called an Intelligent Power Module (IPM) has already been commercialized, which includes a self-protecting circuit for safely suspending its function to supply a power for others when the power module fails, so that the electronic equipment using the power module can be protected from any devastating damages by continuously receiving an excess of or uncontrolled current.

For example, JPA 8-195411 discloses a plurality of strip fuses provided between a terminal and a switching element such as an Insulated Gate Bipolar Transistor (IGBT) chip. When the overcurrent is flown through the switching element, the strip fuse blows preventing smoke and burst (fatal damage) of the IGBT chip. Also, it discloses a chamber encompassing the strip fuses that is filled with arc-extinguishing material.

However, the power module disclosed in the prior art reference is to avoid the fatal problem due to the overcurrent flown through the power switching element to the power module and the electronic equipment incorporating thereof. Therefore, once the power module is damaged by the overcurrent and safely suspends the function of the electronic equipment, the damaged power module has to be replaced so as to again supply normal or controlled current to the electronic equipment. Thus, it is essential to replace the damaged power module with a new one, however, it cannot always be expected that the new power module for replacement is kept in situ, which eventually brings users excessive disadvantage and inconvenience.

Even with the highest level of technique used for manufacturing the power module, it is quite difficult to produce the power module eliminating the possibility of failure due to thermal stress by Joule heat generated from itself and mechanical stress by oscillation transmitted from the electronic equipment, as the power module is being used. In fact, it is almost impossible to manufacture the perfect power module free from any failure eternally.

To avoid the fatal damage of the power module, a regular maintenance is conducted for maintaining the electronic equipment always in a good condition, in which any components possibly causing the fatal problems are routinely inspected and replaced with the new one. Thus, the components that may cause big problems are often replaced before the timing when they actually fail.

Nevertheless, since operation conditions in use substantially give influence to the timing of possible failure when the power module is likely to fail, the timing of possible failure is often inconsistent with the timing of actual replacement. Thus, in some cases, the power module fails before the regular maintenance, or in other cases, it is uniformly replaced with the new one even though it could still be used much longer. Therefore, the same disadvantage suffered in the circumstance where no maintenance is conducted cannot be eliminated, or the maintenance cost is raised because of the undue replacement.

SUMMARY OF THE INVENTION

According to one of the aspects of the present invention, a semiconductor device includes an insulating substrate, and a semiconductor chip mounted on the insulating substrate. The semiconductor chip has a chip electrode thereon. The semiconductor device also includes a first terminal electrically connected with the chip electrode through a first metal wire, and a second terminal electrically connected with the chip electrode through a second metal wire that is more likely to be disconnected than the first metal wire. A signal of disconnection of the second metal wire is output at the second terminal.

BRIEF DESCRIPTION OF THE DRAWINGS

The present invention will more fully be understood from the detailed description given hereinafter and accompanying drawings which are given by way of illustration only, and thus are not limitative of the present invention.

DETAILED DESCRIPTION OF THE PREFERRED EMBODIMENTS

Embodiment 1

Figure 1:
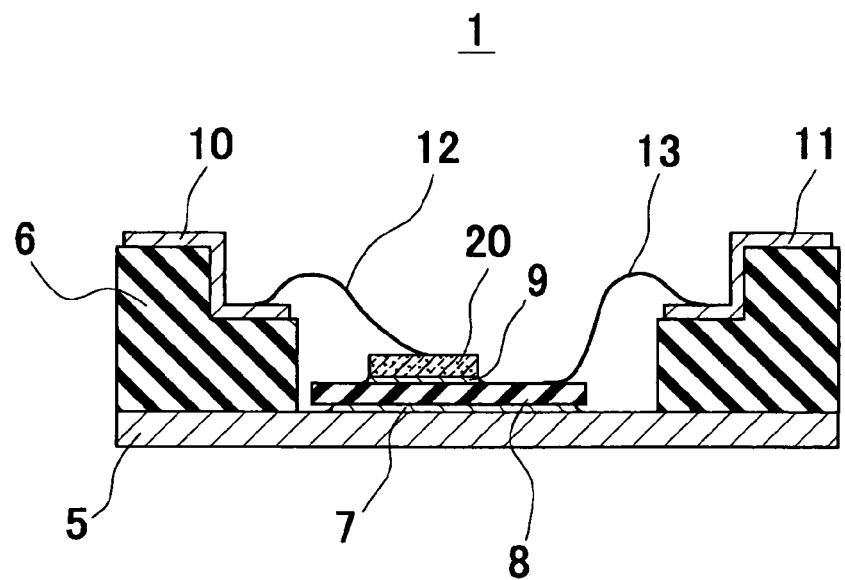
FIG. 1 is a partial cross sectional view of the semiconductor device according to the first embodiment of the present invention.

With reference to FIGS. 1 to 5, the first embodiment of the power module according to the present invention will be described herein. The power module 1 illustrated in FIG. 1 includes, in general, a metal base plate 5 made of metal with good heat conductance such as copper, and a casing 6 made of insulating material such as resin. Also, it includes an insulating substrate 8 with metal patterns (not shown) on its both surfaces, which is attached on the metal base plate 5 via conductive adhesive 7 such as solder. Further, the power module 1 includes a pair of device terminals 10, 11, and a semiconductor chip 20 such as an Insulated Gate Bipolar Transistor (IGBT) chip mounted on the insulating substrate 8 via conductive adhesive 9 such as solder. The semiconductor chip 20 has a chip electrode 22 (See FIG. 2).

Figure 2:
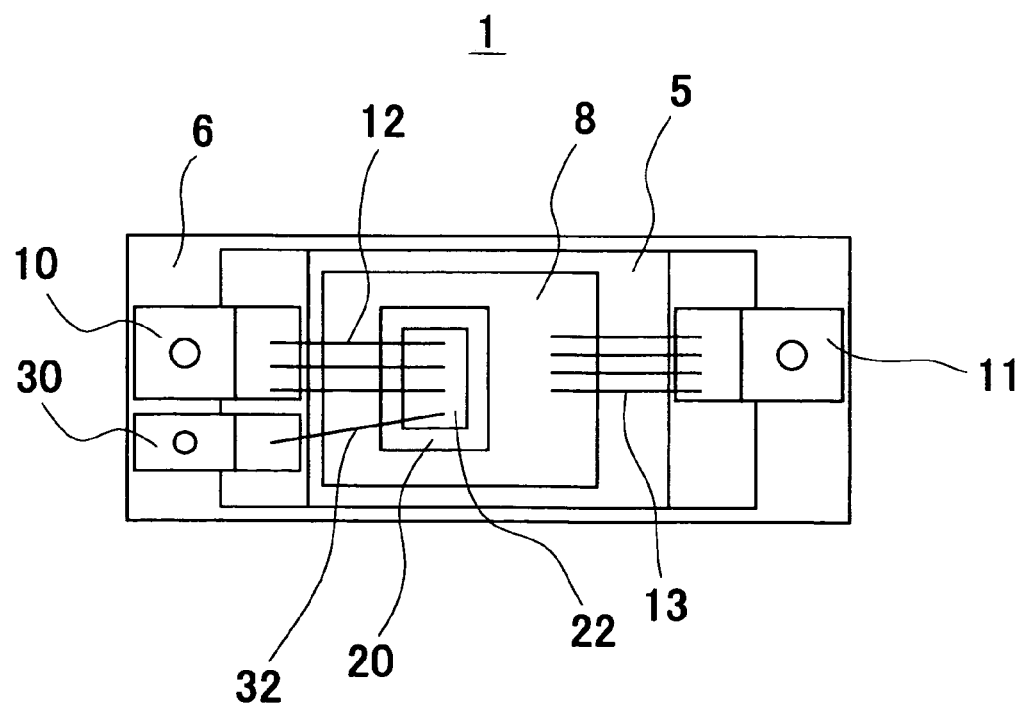
FIG. 2 is a top plan view of the semiconductor device illustrated in FIG. 1.

As can be seen in FIG. 2, the power module 1 has at least one (preferably, one or more) normal metal wire 12 for electrical connection between the device terminal 10 and the chip electrode 22 of the IGBT chip 20, and at least one (preferably, one or more) normal metal wire 13 for electrical connection between the another device terminal 11 and the metal pattern on the insulating substrate 8. Also, the power module 1 of the present embodiment has a dummy terminal 30 arranged in parallel to the device terminal 10 and a dummy metal wire 32 for electrical connection between the dummy terminal 30 and the chip electrode 22. The metal wires all are made of metal such as aluminum. The device terminal 10 and the dummy terminal 30 are electrically connected to an input 64 (FIG. 5) for power supply of the electronic equipment incorporating the power module 1, such as a motor. Thus, during the operation of the power module 1, the electronic equipment is supplied with current through the normal and dummy wires 12, 32.

It should be noted that although not illustrated in the drawings for clear illustration, silicone gel is filled within the casing 6 and over the IGBT chip 20 and the insulating substrate 8 to protect the IGBT chip 20 and the metal wires 12, 13, 32, which in turn are sealed with epoxy resin and a lid.

Figure 3A:
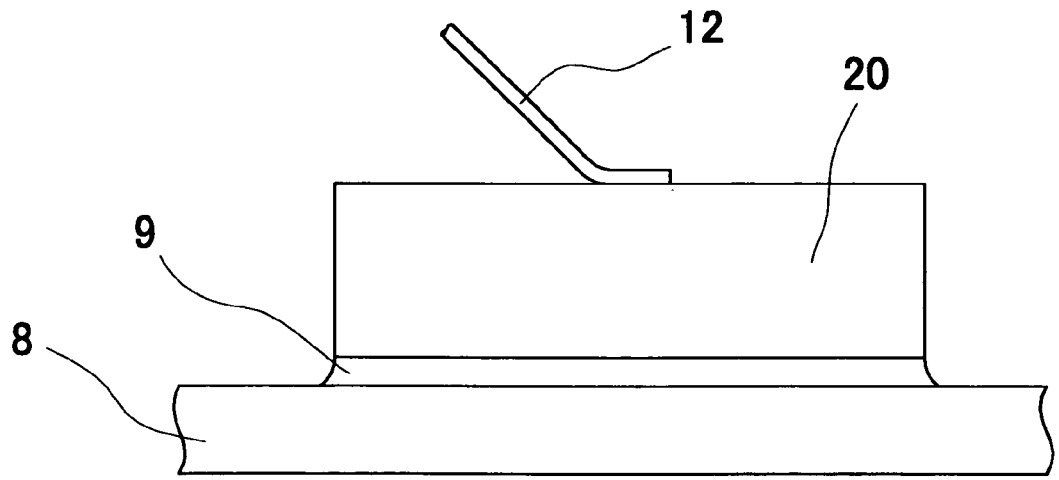
FIG. 3A is a side view of the semiconductor chip.
Figure 3B:
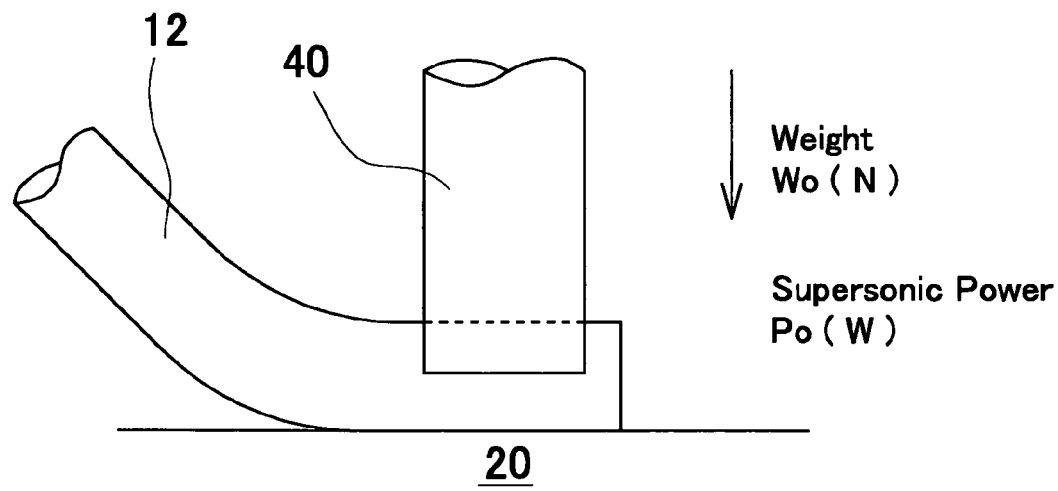
FIGS. 3B and 3C are an enlarged side view and an enlarged elevational view, respectively, illustrating a head of a wirebonder and a metal wire.
Figure 3C:
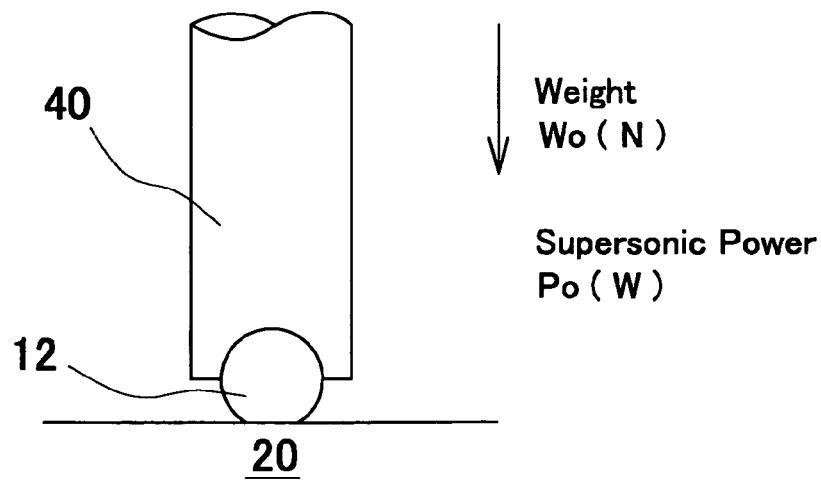

Meanwhile, a wire-bonder having a programmable high-frequency supersonic oscillating unit (not shown) is generally utilized to bond a metal wire such as an aluminum wire. As well known for those skilled in the art, the bonding strength (wire-bonding reliability) between the metal wire 12, and the device terminal 10 and the chip electrode 22 is dependent, for example, upon depressing weight W of a head 40 of the wire-bonder and the supersonic power P for fusing the metal wire as illustrated in FIGS. 3A to 3C. Also, taking account of other factors including material and size of the metal wire 12 as well as material and surface morphology of the device terminal 10 and the chip electrode 22 to be bonded, the optimized bonding condition for the depressing weight W and the supersonic power P is found. The optimized bonding condition is defined herein by the depressing weight $W_0$ (N) and the supersonic power $P_0$ (W).

Figures 4A, 4B, 4C:
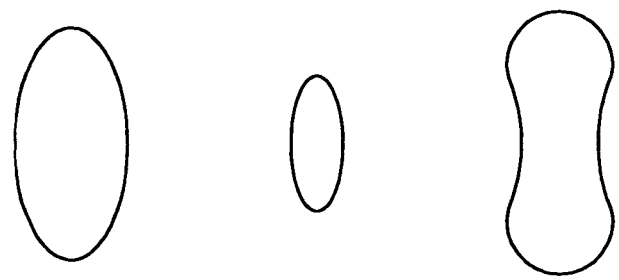
FIGS. 4A–4C are top plan views of wire-bonding interfaces of a normal metal wire and a dummy metal wire.

Thus, when the metal wire 12 is bonded under the optimized condition, the bonding interfaces between the metal wire 12, and the device terminal 10 and the chip electrode 22 ideally has an elliptical shape as shown in FIG. 4A, and the bonding strength is maximized so that the most reliable wire bonding can be expected.

Contrary to the normal metal wire 12, the dummy metal wire 32 of the present embodiment is bonded with the depressing weight W less than the optimized weight $W_0$ ($W<W_0$). Alternatively, the wire-bonder is programmed so that supersonic power P is set to be less than the optimized supersonic power $P_0$ ($P<P_0$), resulting that the dummy metal wire 32 is heated to the temperature (second temperature) less than the temperature (first temperature) of the normal metal wire 12. To this result, the bonding interface of the dummy metal wire (FIG. 4B) has a bonding area smaller than that of the normal metal wire 32 (FIG. 4B). Therefore, the dummy metal wire 32 has the bonding interface that is less reliable and more likely disconnected as the time goes on, due to thermal stress by Joule heat from the power module 1 and mechanical stress transmitted from the electronic equipment incorporating the power module 1.

Further, the program of the wire-bonder may appropriately be modified so that another shape of the bonding interface of the dummy metal wire 32 is formed having a neck portion in the middle like a bottle gourd (FIG. 4C). The bottle gourd shaped dummy metal wire 32 has the bonding strength less than that of the normal metal wire 12. As above, the program of the wire-bonder may appropriately be modified so as to form any shapes of the dummy metal wires 32 with the bonding strength less than that of the normal metal wire 12.

During operation, the power module 1 of the present embodiment is exposed to thermal stress by Joule heat generated from itself and mechanical stress by oscillation transmitted from the electronic equipment. As the operation time passes, exfoliation (separation) and/or micro-crack may run at the bonding interfaces of the normal and dummy metal wires 12, 32 extending from the peripheral to the inside thereof. Eventually, the dummy metal wire 32 is disconnected at the earlier stage than the normal metal wire 12 since the former has the bonding strength less than the later.

Thus, the dummy metal wire 32 is bonded such that the dummy metal wire 32 has a power cycle $L_D$ (which is the operation life time under the predetermined operation condition) being shorter than the power cycle $L_N$ of the normal metal wire 12. Preferably, the power cycle $L_D$ is approximately 80% or more of the power cycle $L_N$ ($L_D \cong 0.8 \times L_N$), and more preferably, the power cycle $L_D$ falls within a range between approximately 85% through 95% of the power cycle $L_N$ ($0.85 \times L_N < L_D < 0.95 \times L_N$). As those skilled in the art would realize, any other evaluation tests rather than the power cycle test can be used to determine the bonding conditions appropriate for the dummy metal wire 32.

According to the power module 1 of the present embodiment, since the normal and dummy metal wires 12, 32 are connected to the device terminal 10 and dummy terminal 30, respectively, it can readily be detected whether or not the dummy metal wire 32 is disconnected, by monitoring the voltage at the dummy terminal 30. An external control circuitry 50 shown in FIG. 5 may be used to readily monitor the voltage at the dummy terminal 30.

Figure 5:
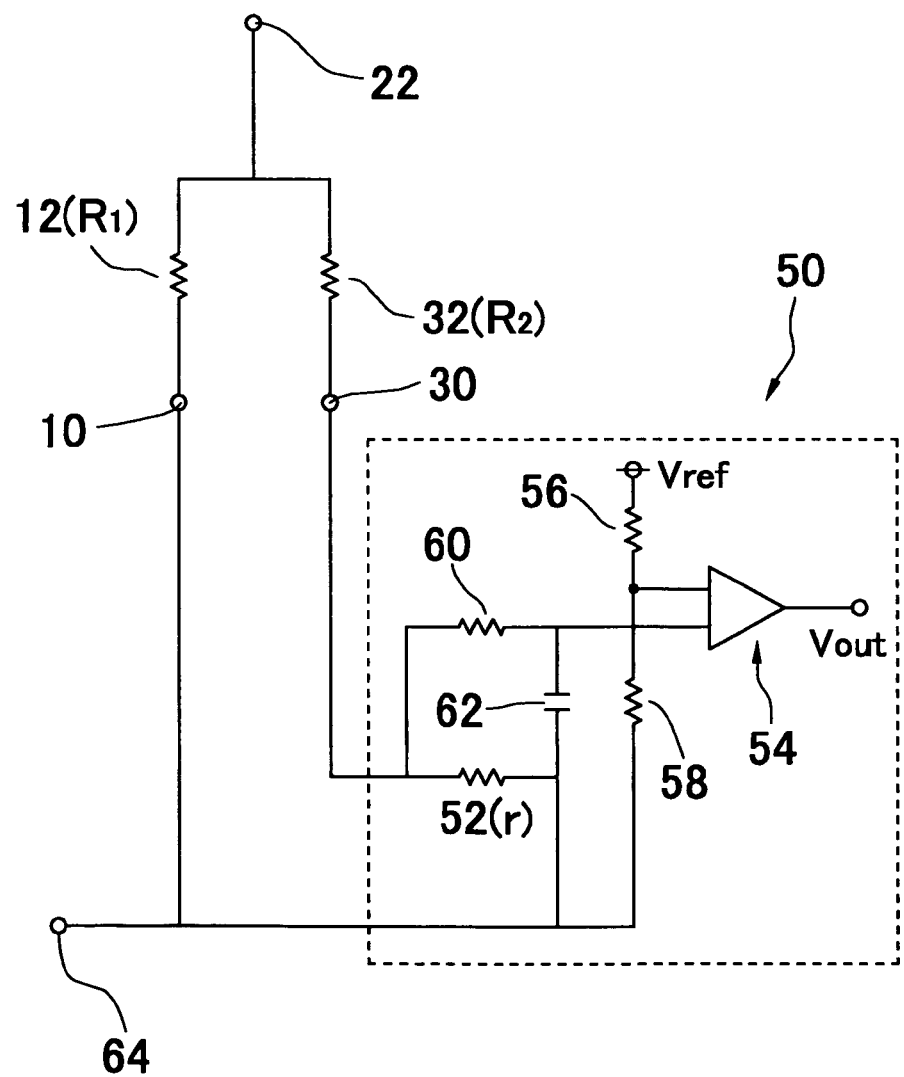
FIG. 5 is a circuit diagram of an external control circuitry incorporated in the semiconductor device.

In FIG. 5, the normal and dummy metal wires 12, 32 both connected to the chip electrode 22 are shown to have the wire inductances $R_1$, $R_2$, respectively, which are connected in parallel to each other. The external control circuitry 50 boxed within the imaginary lines in FIG. 5, generally includes a sensing resistance 52 and a comparator 54. The comparator 54 has one input receiving a reference voltage divided by a pair of resistances 56, 58 from the voltage $V_{ref}$. Also, it has the other input supplied with a voltage drop (potential difference) of the sensing resistance 52, which is filtered by a low pass filter consisting of a resistance 60 and a capacitance 62.

When the dummy metal wire 32 is disconnected (the wire inductance $R_1$ is infinite), no current is flown through the sensing resistance 52. Thus, the comparator 54 detects no voltage drop (potential difference) of the sensing resistance 52 and thereby to determine that the dummy metal wire 32 is disconnected and to switch the output signal $V_{out}$ to a low level. To this end, the external control circuitry 50 detects the disconnection of the dummy metal wire 32 and gives an alarm to the user with any appropriate indicators (not shown). Alternatively, the external control circuitry 50 may provide the low level of the output signal $V_{out}$ with a driving circuitry (not shown) to safely suspend the operation of the semiconductor chip 20.

As above, according to the present embodiment, the voltage drop of the sensing resistance 52 is monitored to detect the disconnection of the dummy metal wire 32, which is less reliable than the normal metal wire 12, and the alarm appeals the user when the power module 1 should be replaced with a new one at the cost-effective timing prior to actual failure thereof. Therefore, the present embodiment of the invention realizes the maintenance of the electronic equipment at more reasonable cost without the fatal damage to the electronic equipment due to the failure of the power module 1.

Embodiment 2

Figure 6:
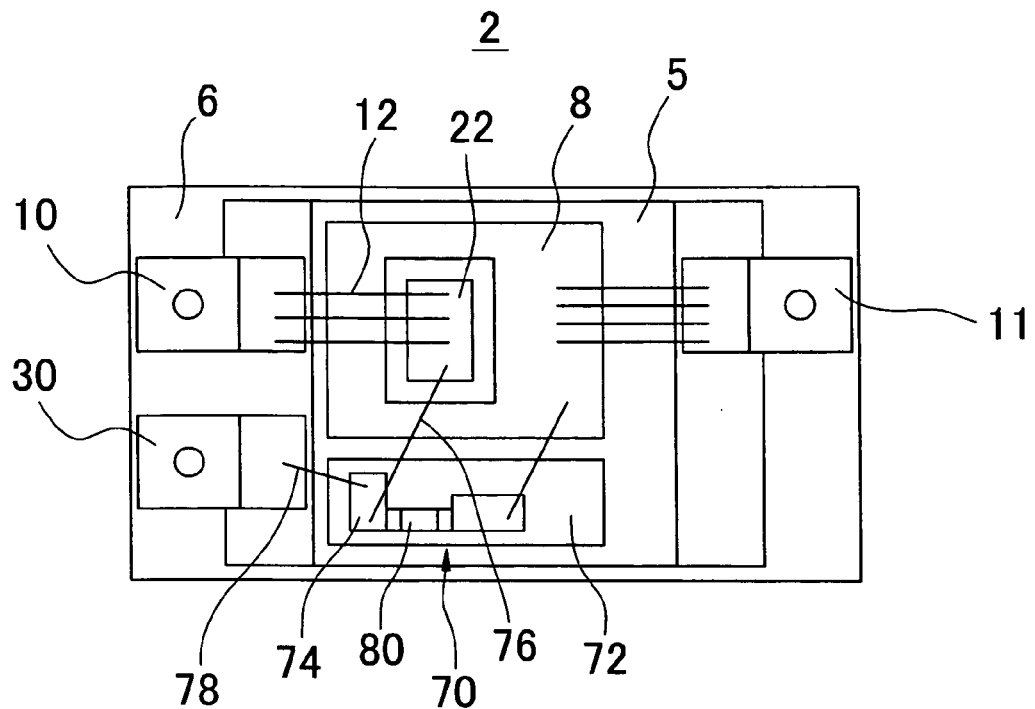
FIG. 6 is a top plan view of a semiconductor device according to the second embodiment of the present invention.

Referring to FIG. 6, the second embodiment of the power module according to the present invention will be described herein. The power module of the second embodiment is similar to the power module of the first embodiment except that the control circuitry is encompassed within the casing. Therefore, the duplicated description in detail for the common features will be eliminated.

As clearly illustrated in FIG. 6, the power module 2 according to the second embodiment includes a built-in control circuitry 70 within the casing 6. The built-in control circuitry 70 has the circuit diagram similar to that of the first embodiment. In FIG. 6, the control circuitry 70 includes a control circuit board 72, a pattern electrode 74 formed thereon, a dummy metal wire 76 for electrical connection between the chip electrode 22 and the pattern electrode 74, and a metal wire 78 for electrical connection between the pattern electrode 74 and the second terminal 30. Also, the control circuitry 70 includes the sensing resistance 80 connected to the pattern electrode 74. Although details are not illustrated in FIG. 6, as mentioned above, the built-in control circuitry 70 has the circuit diagram similar to that of the external control circuitry 50 of FIG. 5.

While the sensing resistance 80 is formed as a chip resistance mounted on the control circuit board 72 in FIG. 6, it can be structured as any type of resistance, including for example, a wire inductance of the metal pattern on the control circuit board 72.

Therefore, according to the second embodiment, like the first embodiment, the control circuitry 70 can detect the disconnection of the dummy metal wire 76 less reliable than the normal metal wire 12, so as to predict the normal metal wire 12 being possibly disconnected in near future. This avoids the fatal problems because of the disconnection of the normal metal wire 12.

Figure 7:
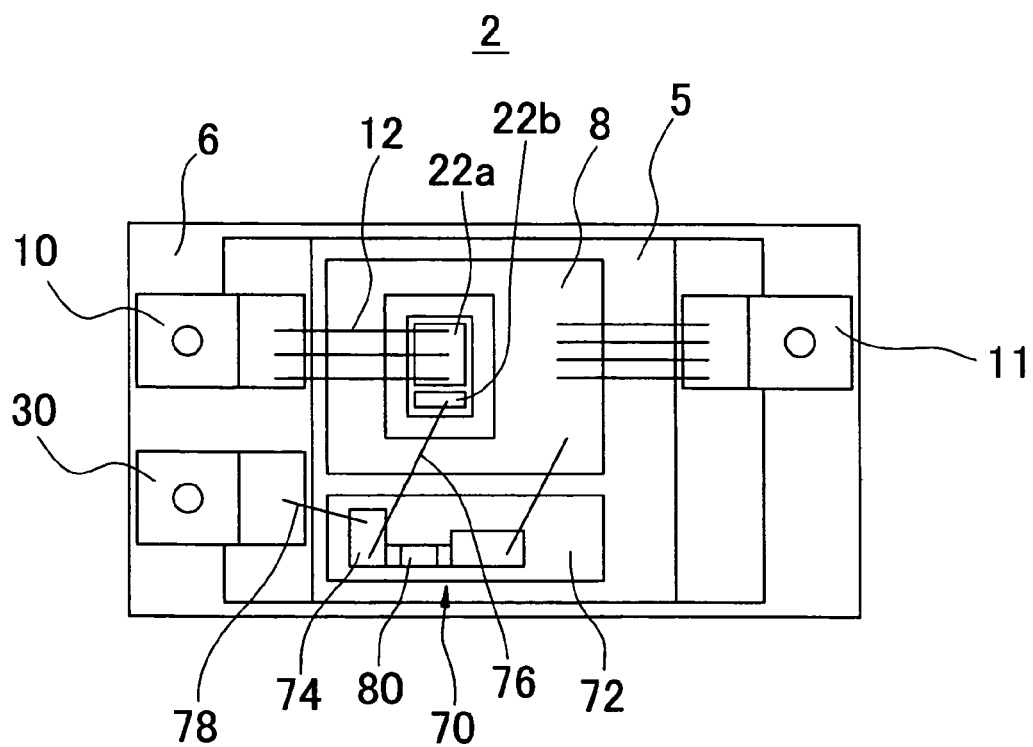
FIG. 7 is a top plan view of another semiconductor device according to the second embodiment.

It should be noted that the IGBT chip 20 may be formed by monolithically integrating a main-current cell and sense-current cell (not shown), which include a main emitter electrode (main chip electrode) 22*a* and a sense emitter electrode (sense chip electrode) 22*b*, respectively. Thus, the chip electrode 22 of FIGS. 2 and 6 is shown as a single electrode, the semiconductor chip 20 may include the main emitter electrode 22*a* for main current and the sense emitter electrode 22*b* for sense current rather than main current, as shown in FIG. 7. Also, the normal metal wire 12 and the dummy metal wire 76 are bonded onto the main emitter electrode 22*a* and the sense emitter electrode 22*b*, respectively.

Next, several modifications for the first and second embodiments will be described herein, in which FIGS. 8-10 corresponding to those of the first embodiment are used just for clear understandings.

Modification 1

Figure 8:
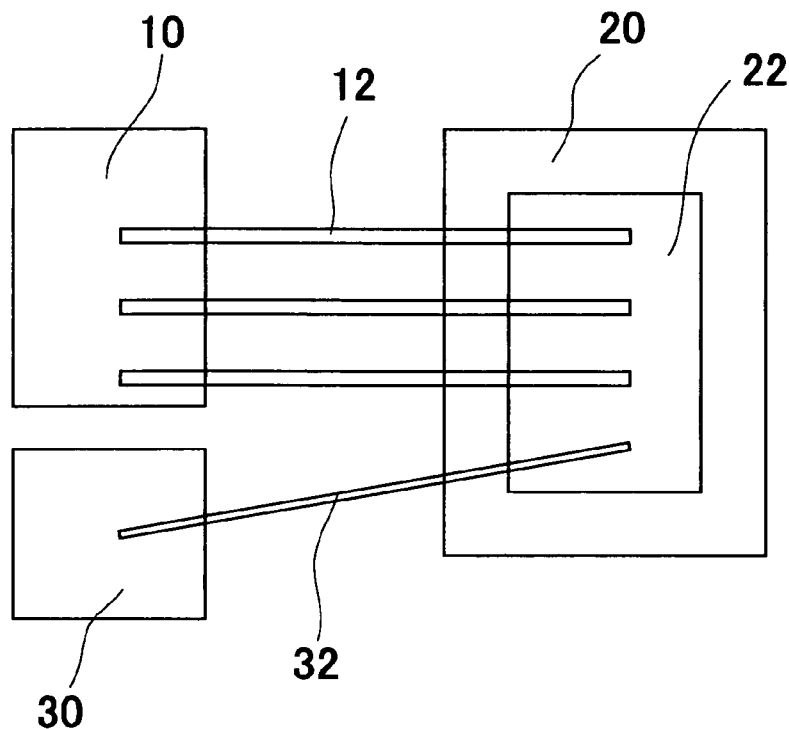
FIG. 8 is a partial enlarged top view of the semiconductor device according to the first modification.

As illustrated in FIG. 8, the power module 1 of the first modification is similar to that of the first embodiment except that it has the dummy metal wire 32 thinner, i.e., having a smaller cross section than that of the first embodiment. Therefore, the duplicated description in detail for the common features will be eliminated.

The bonding interface of the dummy metal wire 32 bonded even under the optimized bonding condition has the bonding strength and the bonding area which cannot extend beyond those of the normal metal wire 12, because of the reduced diameter (cross section). Thus, the dummy metal wire 32 less reliable and more likely to be disconnected than the normal metal wire 12 can be bonded in a controlled manner. In the power module 1 so structured, the disconnection of the dummy metal wire 32 alarms the user that the possibility of the failure of the power module 1 due to the disconnection of the normal metal wire 12 is increasing. Upon receiving the alarm, the user can maintain and/or replace the possibly failing power module 1 with a new one in a cost-effective manner before the actual failure of the power module 1, avoiding any fatal problems to the electronic equipment incorporating the power module 1.

Modification 2

Figure 9:
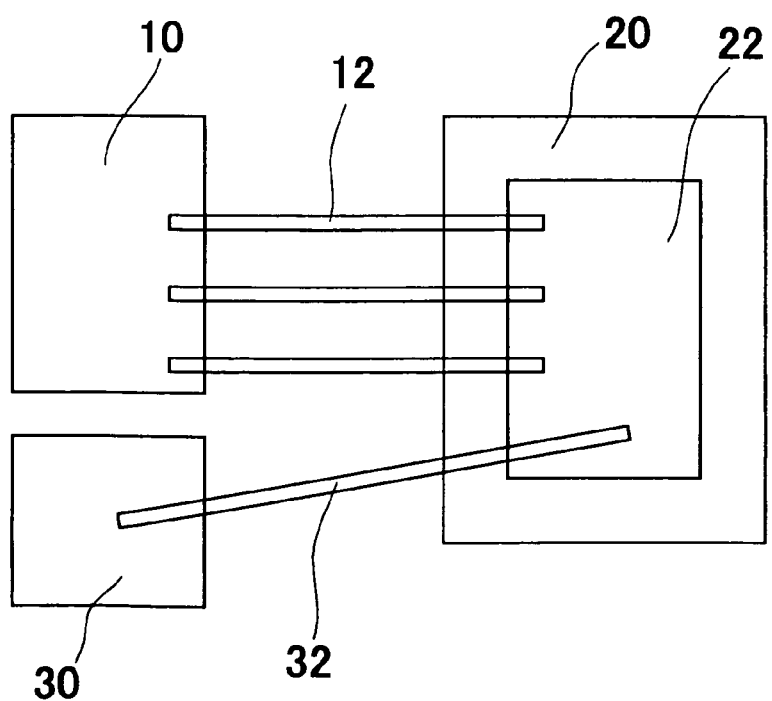
FIG. 9 is a partial enlarged top view of the semiconductor device according to the second modification.
Figure 10:
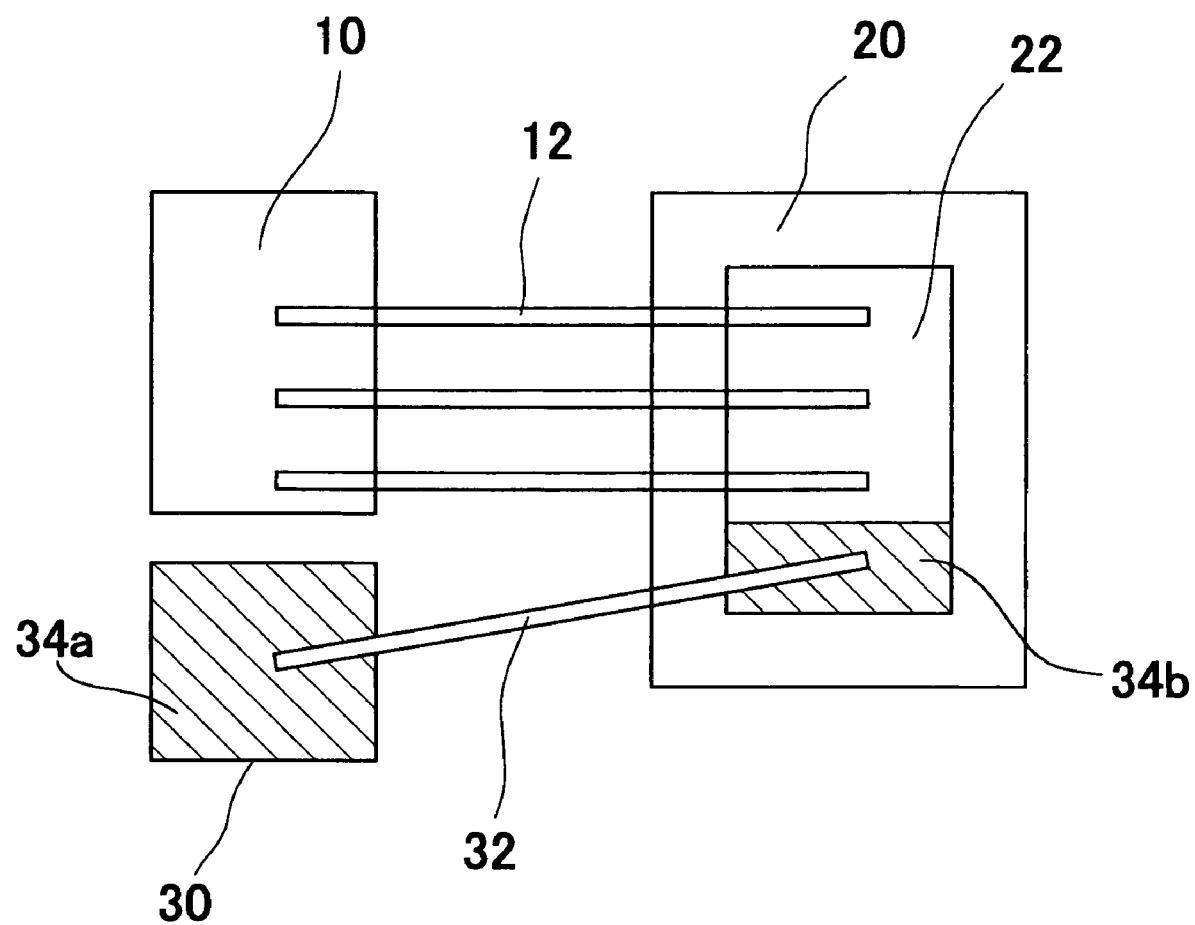
FIG. 10 is a partial enlarged top view of the semiconductor device according to the fourth modification.

As illustrated in FIG. 9, the power module 1 of the second modification is similar to that of the first embodiment except that it has the dummy metal wire longer than that of the normal metal wire. Therefore, the duplicated description in detail for the common features will be eliminated.

In general, as the metal wire is longer, it generates greater Joule heat during operation. Thus, in this modification, the dummy metal wire 32 is formed longer than the normal metal wire 12, generating greater heat so that the bonding interface of the dummy metal wire 32 suffers the thermal stress greater than that the normal metal wire 12. This designs the dummy metal wire 32 to more easily be disconnected at the bonding interface than the normal metal wire 12. To this end, similar to the aforementioned embodiments, when the user learns that the dummy metal wire 32 is disconnected, he or she can replace the possibly failing power module 1 with a new one in a cost-effective manner before the actual failure of the power module 1, without any devastating problems to the electronic equipment using the power module 1.

Modification 3

Although not illustrated in the drawings, the power module 1 of the third modification is similar to that of the first embodiment except that the dummy metal wire is made of material different from one of the normal metal wire. Therefore, the duplicated description in detail for the common features will be eliminated.

The normal metal wire 12 is made of material, for instance, aluminum alloy containing 95 weight % of aluminum and 5 weight % of nickel. On the other hand, the dummy metal wire 32 is made of material, for instance, aluminum alloy containing 90 weight % of aluminum and 10 weight % of nickel. This causes the bonding strength of the dummy metal wire 32 less than that of the normal metal wire 12 so that the former is disconnected at earlier stage than the latter. Similarly, in the power module 1 so structured, when informed of the disconnection of the dummy metal wire 32, the user can maintain and/or replace the possibly failing power module 1 with a new one in a cost-effective manner before the actual failure of the power module 1.

Modification 4

According to the fourth modification, the power module 1 is designed such that the dummy metal wire has a coating on the dummy terminal and/or a partial area of the IGBT chip. Since other structures of the fourth modification are similar to those of the first embodiment, no duplicated description will be made.

It is well known that the wire bonding of the metal wires 12, 32 against the terminals 10, 30 and the chip electrode 22 is achieved based upon the molecular attraction between the metal molecules of those components. According to the fourth modification, prior to bonding the metal wire, a coating 34a for reducing the bonding strength is applied on the top surface of the dummy terminal 30, i.e., the bonding interface (fourth bonding interface). Thus, the fourth bonding interface has bonding strength less than that of the bonding interface defined between the normal metal wire 12 and the normal terminal 10 (third bonding interface). Alternatively, or in addition to that, another coating 34b may be formed on the partial area of the chip electrode 22. To this end, the power module 1 is also designed such that the dummy metal wire 32 is less reliable than the normal metal wire 12. Similarly, the user can replace the possibly failing power module 1 with a new one in a cost-effective manner before the actual failure of the power module 1, when noticed that dummy metal wire 32 is disconnected.

What is claimed is:

1. A semiconductor device, comprising:
   an insulating substrate;
   a semiconductor chip mounted on said insulating substrate, the semiconductor chip having a chip electrode thereon;
   a first terminal electrically connected with the chip electrode through a first metal wire; and
   a second terminal electrically connected with the chip electrode through a second metal wire that is more likely to be disconnected than said first metal wire;
   wherein a signal of disconnection of said second metal wire is output at said second terminal.

2. The semiconductor device according to claim 1, further comprising:
   a sensing resistance electrically connected to said second terminal; and
   a control circuitry for detecting disconnection of said second metal wire by monitoring voltage drop of said sensing resistance.

3. The semiconductor device according to claim 1,
   wherein said chip electrode includes a main chip electrode and a sense chip electrode, and
   wherein said second metal wire is electrically connected to the sense chip electrode.

4. The semiconductor device according to claim 1,
   wherein a second bonding interface between said second metal wire and said chip electrode has bonding strength less than that of a first bonding interface between said first metal wire and said chip electrode.

5. The semiconductor device according to claim 1,
   wherein said second metal wire is thinner than said first metal wire.

6. The semiconductor device according to claim 1,
   wherein said second metal wire is longer than said first metal wire.

7. The semiconductor device according to claim 1,
   wherein said first and second metal wires are made of material different from each other.

8. The semiconductor device according to claim 1, further comprising a coating for reducing bonding strength at either one of interfaces between said second metal wire and said chip electrode, and between said second metal wire and said second terminal.

9. A semiconductor device, comprising:
   an insulating substrate;
   a semiconductor chip mounted on said insulating substrate, the semiconductor chip having a chip electrode thereon; and
   first and second metal wires bonded on said chip electrode, defining first and second bonding interfaces between said first metal wire and said chip electrode, and between said second metal wire and said chip electrode, respectively;
   wherein said second bonding interface has bonding strength less than that of the first bonding interface.

10. A semiconductor device, comprising:
    an insulating substrate;
    a semiconductor chip mounted on said insulating substrate, the semiconductor chip having a chip electrode thereon; and
    first and second metal wires bonded on said chip electrode;
    a sensing resistance electrically connected to said second metal wire; and
    a control circuitry for detecting disconnection of said second metal wire by monitoring voltage drop of said sensing resistance.

* * * * *